(12) United States Patent
Hall

(10) Patent No.: US 10,242,988 B2
(45) Date of Patent: Mar. 26, 2019

(54) ANTIFUSES INTEGRATED ON SEMICONDUCTOR-ON-INSULATOR (SOI) SUBSTRATES

(71) Applicant: NXP USA, INC., Austin, TX (US)

(72) Inventor: Mark Douglas Hall, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/684,126

(22) Filed: Aug. 23, 2017

(65) Prior Publication Data

US 2019/0067304 A1 Feb. 28, 2019

(51) Int. Cl.
| | |
|---|---|
| G11C 17/00 | (2006.01) |
| H01L 27/112 | (2006.01) |
| H01L 23/525 | (2006.01) |
| H01L 29/06 | (2006.01) |
| H01L 29/78 | (2006.01) |
| G11C 17/14 | (2006.01) |
| H01L 49/02 | (2006.01) |
| H01L 29/861 | (2006.01) |

(52) U.S. Cl.
CPC ........ H01L 27/11206 (2013.01); G11C 17/14 (2013.01); H01L 23/5252 (2013.01); H01L 29/0649 (2013.01); H01L 29/7816 (2013.01); H01L 28/60 (2013.01); H01L 29/78 (2013.01); H01L 29/861 (2013.01)

(58) Field of Classification Search
CPC ........... H01L 27/11206; H01L 23/5252; H01L 29/0649; H01L 29/7816; H01L 28/60; H01L 29/78; G11C 17/14

USPC .................................. 365/96; 257/529, 530
See application file for complete search history.

(56) References Cited

U.S. PATENT DOCUMENTS

| | | | | |
|---|---|---|---|---|
| 5,982,005 | A * | 11/1999 | Hidaka | H01L 27/1203 257/347 |
| 6,319,120 | B1 * | 11/2001 | Motosko | A63F 9/24 273/445 |
| 6,667,902 | B2 | 12/2003 | Peng | |
| 7,553,704 | B2 * | 6/2009 | Min | H01L 23/5252 257/E21.625 |
| 7,678,620 | B2 | 3/2010 | Hoefler | |
| 9,613,899 | B1 * | 4/2017 | Adusumilli | H01L 23/5256 |
| 9,633,943 | B2 * | 4/2017 | Cheng | H01L 23/5252 |
| 9,754,875 | B1 * | 9/2017 | Fogel | H01L 23/5256 |
| 9,929,091 | B2 * | 3/2018 | Li | H01L 23/5256 |
| 2006/0234428 | A1 * | 10/2006 | Furukawa | H01L 21/84 438/149 |
| 2008/0217736 | A1 * | 9/2008 | Cestero | H01L 23/5252 257/530 |
| 2009/0032884 | A1 * | 2/2009 | Tsuchiya | H01L 21/82383 257/369 |

(Continued)

FOREIGN PATENT DOCUMENTS

CN 101740569 B 11/2011

*Primary Examiner* — Viet Q Nguyen

(57) ABSTRACT

An integrated circuit (IC) system includes a substrate, a first doped well of a first polarity in the substrate, a first electrode in contact with the doped well, a buried oxide (BOX) in contact with the doped well in the substrate, a first IC device including a second electrode formed on the BOX, and fuse control circuitry coupled to the first electrode and the second electrode. The fuse control circuitry is configured to cause voltages to be applied to the first and second electrodes to change a resistance level of the BOX in the vicinity of the second electrode.

28 Claims, 1 Drawing Sheet

(56) References Cited

U.S. PATENT DOCUMENTS

| | | | | |
|---|---|---|---|---|
| 2010/0072453 A1* | 3/2010 | Jeong | ................ | H01L 27/2463 |
| | | | | 257/5 |
| 2012/0319234 A1* | 12/2012 | Cho | ................ | H01L 23/5256 |
| | | | | 257/529 |
| 2014/0091427 A1* | 4/2014 | Jeon | ................ | H01L 23/5226 |
| | | | | 257/529 |
| 2017/0062333 A1* | 3/2017 | Kurz | ................ | H01L 23/5256 |
| 2018/0061757 A1* | 3/2018 | Li | ................ | H01L 23/5256 |

* cited by examiner

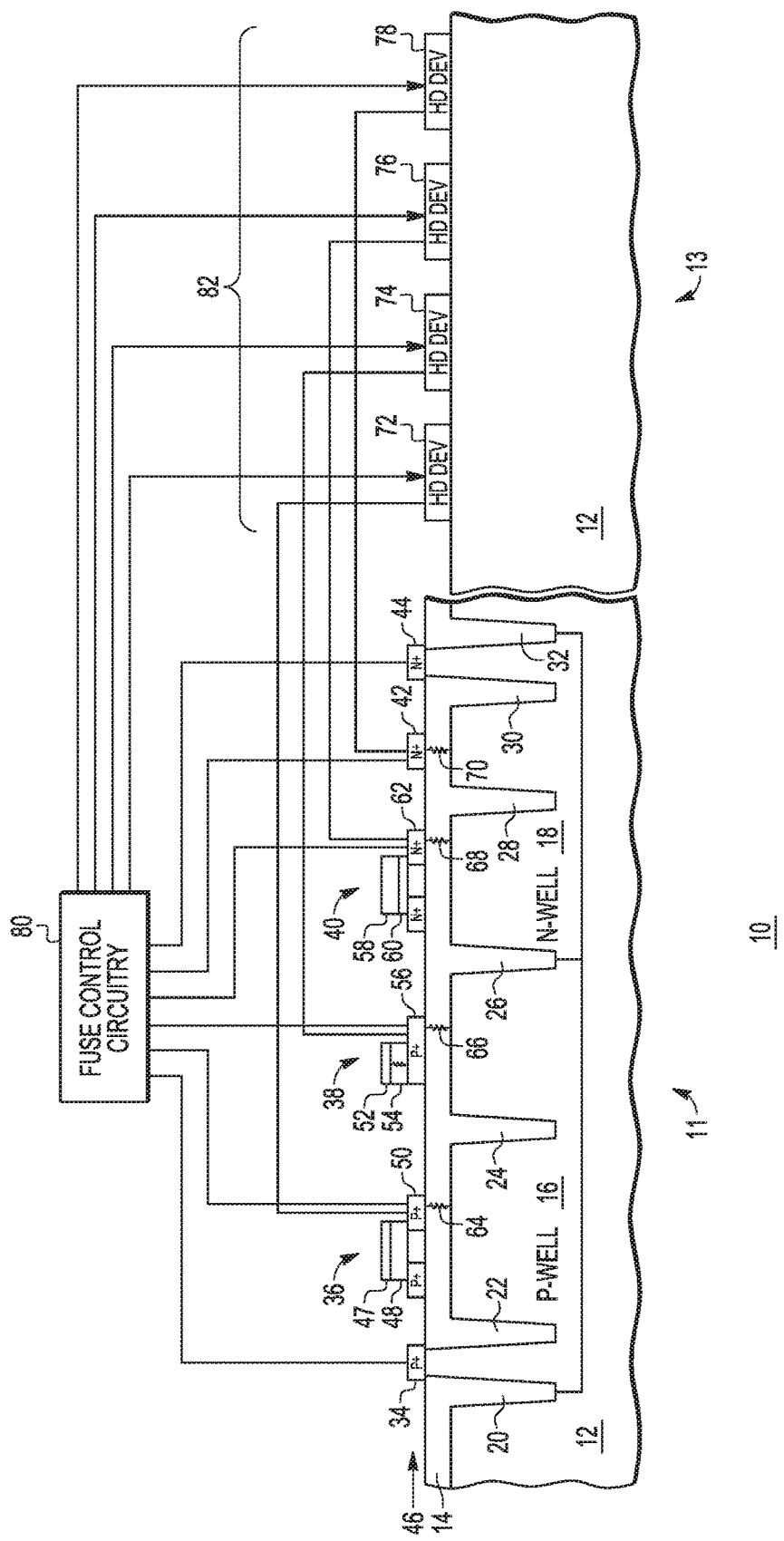

ANTIFUSES INTEGRATED ON SEMICONDUCTOR-ON-INSULATOR (SOI) SUBSTRATES

BACKGROUND

Field

This disclosure relates generally to antifuses, and more specifically, to antifuses integrated on SOI substrates.

Related Art

Antifuses are fuses that are blown to create a low resistance state and are commonly used in many integrated circuit applications as one-time programmable non-volatile storage. However, antifuses are large devices which take up valuable real estate in circuits. Therefore, a need exists for antifuses which take up less circuit real estate.

BRIEF DESCRIPTION OF THE DRAWINGS

The present invention is illustrated by way of example and is not limited by the accompanying FIGURES, in which like references indicate similar elements. Elements in the figures are illustrated for simplicity and clarity and have not necessarily been drawn to scale.

FIG. 1 illustrates in partial cross-sectional form and partial block diagram form, an integrated circuit having antifuses and fuse control circuitry, in accordance with one embodiment of the present invention.

DETAILED DESCRIPTION

Fully depleted semiconductor-on-insulator (FDSOI) substrates include a carrier substrate with a buried oxide (BOX) layer over the carrier substrate. Over the BOX layer is a thin silicon layer in which active circuitry is formed. In one embodiment, the BOX layer itself is used as the dielectric of an antifuse. In this embodiment, part of the silicon layer on top of the BOX layer is used as a first electrode of an antifuse and wells in the carrier substrate under the BOX layer are used as a second electrode of the antifuse. The first electrode may correspond to active circuitry within the silicon layer, such as a source/drain electrode of a metal-oxide-semiconductor field-effect transistor (MOSFET) on top of the BOX layer or an electrode of a capacitor or diode formed on top of the BOX layer. Depending on the thickness of the BOX layer, a minimum programming voltage is needed across the antifuse dielectric (the BOX layer) in order to break down the dielectric and program it to a low resistance state. Currently, with BOX thickness being about 150-250 Angstroms, higher programming voltages are needed to blow the antifuse than achievable with conventional complementary metal-on-semiconductor (CMOS) devices, therefore, high voltage devices, such as laterally diffused MOSFET (LDMOS) devices, can be used as programming devices for the antifuses.

FIG. 1 illustrates in partial cross-sectional form and partial block diagram form, an integrated circuit (IC) 10 having antifuses 64, 66, 68, and 70, fuse control circuitry 80, and programming devices 82, in accordance with one embodiment of the present invention. Note that IC 10 may also be referred to as an IC system. IC 10 includes a carrier substrate 12, which, when part of a wafer, may be referred to as a carrier wafer. In a first portion 11 of IC 10, a BOX layer 14 is located on carrier substrate 12, and a thin active silicon layer 46 is located on BOX layer 14. IC devices 36, 38, 40, and 42 are formed in active silicon layer 46 and are located on BOX layer 14. In a second portion 13 of IC 10, a bank 82 of high voltage programming devices is formed on and in carrier substrate 12. In second portion 13, BOX layer 14 is removed prior to formation of bank 82 such that the programming devices are formed directly on and in substrate 12.

A P-well region 16 and an N-well region 18 are formed in substrate 12 in first portion 11. Isolation regions 20, 22, 24, 26, 28, 30, and 32 extend from BOX layer 14 into substrate 12 in P-well 16 or N-well 18. A P+ contact region 34 is formed on P-well 16 on and in substrate 12 between isolation regions 20 and 22 and provides an electrical contact to P-well 16. In between isolation regions 20 and 22, BOX layer 14 is removed such that BOX layer 14 is not present between contact region 34 and P-well 16. Similarly, an N+ contact region 44 is formed on N-well 18 on and in substrate 12 between isolation regions 30 and 32 and provides an electrical contact to N-well 18. In between isolation regions 30 and 32, BOX layer 14 is removed such that BOX layer 14 is not present between contact region 44 and N-well 18. Each of contact regions 34 and 44 are formed on and in substrate 12. Note that isolation regions 20, 22, 24, 26, 28, 30, and 32 extend into substrate 12 but do not extend through the bottoms of P-well 16 and N-well 18.

Device 36 is formed directly on BOX layer 14, over P-well 16 and between isolation regions 22 and 24. Device 36 is a MOSFET device having source/drain electrodes labeled "P+", such as highly doped P+ source/drain electrode 50, and a channel region located between the source/drain electrodes. Each of the source/drain electrodes and channel region is formed from thin active silicon layer 46. Note that the channel region has an opposite polarity to the source/drain electrodes. Device 36 includes a gate dielectric 48 over the channel region and over portions of the source/drain electrodes, and a gate electrode 47 over gate dielectric 48. Further details of device 36 are not illustrated in FIG. 1, such as sidewall spacers, liners, raised source/drains, etc. These elements are known elements and known variations, and in alternate embodiments, device 36 may include more elements than those illustrated in FIG. 1. Also, thinner or thicker gate dielectrics may be used, or a gate dielectric including various different materials may be used. In one example, device 36 may correspond to an input/output device and in another example, device 36 may correspond to a core device, in which the gate dielectric would be of an appropriate material and thickness for each type of device.

Device 38 is a capacitor formed directly on BOX layer 14, over P-well 16 and between isolation regions 24 and 26. Device 38 is a capacitor having a bottom electrode 56 directly on BOX layer 14, a capacitor dielectric 54 on bottom electrode 56, and a top electrode 52 on capacitor dielectric 54. In one embodiment, capacitor 38 can be used as an antifuse in which a high voltage can be placed across the top and bottom electrodes to break down capacitor dielectric 54 to program the antifuse to a low resistance state.

Device 40 is formed directly on BOX layer 14, over N-well 18 and between isolation regions 26 and 28. Device 40 is a MOSFET device having source/drain electrodes labeled "N+", such as highly doped N+ source/drain electrode 62, and a channel region located between the source/drain electrodes. Each of the source/drain electrodes and channel region is formed from thin active silicon layer 46. Note that the channel region has an opposite polarity to the source/drain electrodes. Device 40 includes a gate dielectric 60 over the channel region and over portions of the source/ drain electrodes, and a gate electrode 58 over gate dielectric 60. Further details of device 40 are not illustrated in FIG. 1, such as sidewall spacers, liners, raised source/drains, etc. These elements are known elements and known variations, and in alternate embodiments, device 40 may include more elements than those illustrated in FIG. 1. Also, thinner or thicker gate dielectrics may be used, or a gate dielectric including various different materials may be used. In one example, device 40 may correspond to an input/output device and in another example, device 40 may correspond to a core device, in which the gate dielectric would be of an appropriate material and thickness for each type of device. Note that in the illustrated embodiment, gate dielectric 60 of device 40 is thinner than gate dielectric 48 of device 36.

Device 42 is a highly doped N+ region formed from thin active layer 46 and is formed directly on BOX layer 14, over N-well 18, and between isolation regions 28 and 30. In one embodiment, device 42 is a stand-alone N+ region. In an alternate embodiment, device 42 is a diode device in which a highly doped P+ region, also formed from thin active layer 46, would be formed immediately adjacent the highly doped N+ region, such as behind the highly doped N+ region and thus not visible in the cross section of FIG. 1. Note that the highly doped N+ region may also be referred to as an electrode.

As illustrated in FIG. 1, under each of electrode 50 of device 36, electrode 56 of device 38, electrode 62 of device 40, and electrode 42 of device 42, BOX layer 14 forms an antifuse 64, 66, 68, and 70, respectively. That is, each antifuse is formed from BOX layer 14 in the vicinity of a corresponding electrode of a corresponding device. Prior to programming these antifuses, BOX layer 14 provides a high resistive state between the corresponding electrode of the corresponding device and underlying well, P-well 16 or N-well 18. Each antifuse can be programmed by applying a high voltage between the corresponding electrode on top of BOX layer 14 and the underlying P-well or N-well so as to change the resistance level of BOX layer 14 in the vicinity of the corresponding electrode to a low resistance state. When programmed, an antifuse provides a low resistance path from P-well 16 or N-well 18 to the corresponding electrode.

Note that each antifuse in FIG. 1 is formed with a top electrode located directly on top of BOX layer 14, a portion of BOX layer 14 as the antifuse dielectric, and a bottom electrode formed by the P or N well underlying BOX layer 14. The top electrode may be formed from a corresponding electrode of an active or passive device formed with thin active silicon layer 46 directly on BOX layer 14. In this manner, an electrode of a device formed on BOX layer 14 can be utilized as both an electrode of the device itself as well as a top electrode of an antifuse. For example, electrode 50 may be used as both a source/drain electrode of device 36 and the top electrode for antifuse 64. In the case of a programmed (blown) antifuse, though, the voltage of the electrode of the device would be the same as the underlying P-well or N-well (the bottom electrode for the antifuse). This may limit how the device is used. For example, if antifuse 64 is programmed (or blown), the voltage of electrode 50 would be about the same as P-well 16. Therefore, flexibility is reduced on how to set electrode 50 of device 36. That is, if P-well 16 is grounded, then electrode 50 would also be set to ground. The use of an electrode of a device on top of BOX layer 14 as a top electrode of a BOX layer antifuse saves area but may reduce the flexibility of that device.

In the examples of FIG. 1, antifuses are formed in BOX layer 14 under devices 36, 38, 40, and 42. By vertically integrating these antifuses with circuitry formed on BOX layer 14, area savings can be achieved. Also, in one example, electrode 56 is used as a top electrode of antifuse 66 with P-well 16 being the bottom electrode. Note that in this case, if dielectric 54 of device 38 is also used as an antifuse, two antifuses are vertically stacked on each other, which saves area. Furthermore, each antifuse formed from BOX layer 14 is locally formed under its corresponding top electrode. In this manner, any number of antifuses can be formed in BOX layer 14.

Fuse control circuitry 80 can apply appropriate voltages to the electrodes of each antifuse for programming. Due to the thickness of BOX layer 14, a higher voltage may be required to change the resistance state of BOX layer 14 than can be applied by conventional CMOS devices. In this case, a bank of high voltage programming devices 82 may be located in portion 13 of IC 10, on substrate 12. In the illustrated embodiment, bank 82 includes high voltage device (HV dev) 72 which is connected to electrode 50 of device 36 and of antifuse 64, HV dev 74 which is connected to electrode 56 of device 38 and of antifuse 66, HV dev 76 which is connected to electrode 62 of device 40 and of antifuse 68, and HV dev 78 which is connected to electrode 42 of antifuse 70.

Fuse control circuitry 80 directs programming of one of antifuses 64, 66, 68, or 70 by directing the corresponding HV dev to apply a high program voltage (i.e. write voltage) to the corresponding electrode while applying a well voltage to the corresponding well contact 34 or 44. For example, to program antifuse 64, fuse control circuitry may apply 0V to contact 34 (and thus P-well 16, which is the bottom electrode of antifuse 64) and directs HV device 72 to apply a high enough voltage to electrode 50 (the top electrode of antifuse 64) such that the resistance of Box layer 14 under electrode 50 changes to a low resistance state. In one embodiment, fuse control circuitry 80 can direct a HV device to apply a programming voltage with a signal indicating that a programming voltage be applied to the corresponding electrode of an IC device. In one embodiment, this signal may also indicate the value of the programming voltage to be applied to the corresponding electrode of the IC device. Programmed data can be programmed into the antifuses by choosing to program or not program each antifuse to place each antifuse into a low or high resistance state, respectively. A high resistance state may correspond to a logic level high and a low resistance state to a logic level low, or vice versa.

In one embodiment, the HV devices in bank 82 are LDMOS devices which are formed directly on and in substrate 12. In this case, BOX layer 14 is removed from portion 13 of substrate 12 to form the HV devices. Alternate embodiments may use different HV devices. However, as the thickness of BOX layer 14 becomes thinner as technology evolves, it may be possible to use other devices to apply the programming voltages, such as conventional CMOS devices or other non-high voltage devices.

Fuse control circuitry 80 also includes circuitry to read the state (i.e. the programmed data) of the antifuses. In one embodiment, fuse control circuitry 80 can apply read voltages, as needed, to the electrodes of each antifuse to determine a resistance state of the antifuse. For example, to read antifuse 64, fuse control circuitry 80 may apply a voltage to electrode 50 and sense the resulting current from electrode 50 to contact 34 to determine if BOX layer 14 has a high or low resistance state, in which one resistance state corresponds to a logic level high and the other to a logic level low. Note that during a read of an antifuse, the antifuse is decoupled from its corresponding HV programming device.

In one embodiment, each electrode used as a top electrode of an antifuse has the same conductivity type (i.e. the same polarity) as the well which provides the bottom electrode of the antifuse. For example, electrodes 50 and 56 are both P-type, as is P-well 16, and similarly, electrodes 62 and 42 are both N-type as is N-well 18.

Therefore, by now it can be appreciated how a BOX layer can be used to vertically integrate antifuses, which results in area savings of an IC. The top electrode of an antifuse is located on the BOX layer with the bottom electrode of the antifuse being the underlying well region (or back gate). The resistance state of the BOX layer located under the top electrode of the antifuse can be changed by applying an appropriate programming voltage. Furthermore, this top electrode of the antifuse may also be an electrode of an active device which is formed on the BOX layer, such as a source/drain electrode of a MOSFET, electrode of a capacitor, or electrode of a diode. The dual use of the top electrode for an IC device and an antifuse allows for the vertical integration of an IC device directly over an antifuse.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans will appreciate that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different active devices on BOX layer 14 may be used to provide a top electrode for an antifuse which uses BOX layer 14 as the antifuse dielectric. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit (IC) system includes a substrate; a first doped well of a first polarity in the substrate; a first electrode in contact with the doped well; a buried oxide (BOX) in contact with the doped well in the substrate; a first IC device including a second electrode formed on the BOX; fuse control circuitry coupled to the first electrode and the second electrode, the fuse control circuitry is configured to cause voltages to be applied to the first and second electrodes to change a resistance level of the BOX in the vicinity of the second electrode. In one aspect, the first IC device is a capacitor further including a third electrode above the second electrode; a layer of oxide between the second electrode and the third electrode. In another aspect, the first IC device is a transistor further including a layer of conductive material on the BOX adjacent the second electrode, wherein the layer of conductive material has a different polarity than the second electrode; a third electrode on the BOX adjacent the layer of conductive material, wherein the second and third electrodes have the same polarity; a layer of gate oxide over the layer of conductive material; and a gate electrode over the layer of gate oxide. In yet another aspect, the IC system further includes a high voltage device formed directly on the substrate, the high voltage device being coupled to receive a signal indicating a voltage to be applied to the first IC device from the fuse control circuitry, and to provide a voltage signal to the first IC device. In a further aspect, the high voltage device is a laterally diffused metal oxide semiconductor (LDMOS) transistor. In another aspect of this embodiment, the voltages applied to the first and second electrodes create a low resistance path by causing the BOX to breakdown in the vicinity of the second electrode. In yet another aspect of this embodiment, the voltages are applied to the first and second electrodes to write a data value by changing the resistance level, and different voltages are applied to the first and second electrodes to read the resistance level. In a further aspect, the IC system further includes a connection between the gate electrode and a voltage source and between the third electrode and another component. In another further aspect, the IC system further includes a connection between the third electrode and another component.

In another embodiment, a method of programming data in a one-time programmable integrated circuit component, includes applying a first voltage to a first electrode contacting a doped well in a semiconductor substrate; and applying a write voltage to a second electrode on a buried oxide (BOX) layer, wherein the BOX layer overlies the doped well, the second electrode is part of an active IC component formed on the BOX layer, the write voltage changes a resistance level of the BOX layer under the second electrode to program the data; and the first and second electrodes and the doped well have a first polarity. In one aspect, the method further includes applying a read voltage to the second electrode to read the data programmed in the one-time programmable circuit component. In a further aspect, the method further includes applying the write voltage using a high-voltage device coupled to the second electrode. In yet a further aspect, the method further includes providing a signal to the high-voltage device to control the applying the write voltage. In yet an even further aspect, the method further includes operating the active IC component to perform a different circuit function than the one-time programmable IC component. In yet a further aspect, the active IC component is one of a transistor, a capacitor, or a diode.

In yet another embodiment, an integrated circuit system includes a semiconductor substrate; a buried oxide (BOX) layer over a portion of the substrate; a first doped well having a first polarity in the semiconductor substrate under the BOX layer; a second doped well having a second polarity opposite the first polarity in the semiconductor substrate under the BOX layer; a first electrode of the first polarity on the substrate and in direct contact with the first doped well; a second electrode of the second polarity on the substrate and in direct contact with the second doped well; a first active IC device including a third electrode of the first polarity over the BOX layer and the first doped well; a second active IC device including a fourth electrode of the second polarity over the BOX layer and the second doped well; a first voltage source coupled to the first electrode; a second voltage source coupled to the second electrode; a third voltage source coupled to the third electrode; a fourth voltage source coupled to the fourth electrode; control circuitry coupled to the third and fourth electrodes and configured to read a resistance level of the BOX layer between the third and fourth electrodes and the first and second doped wells. In one aspect of this yet another embodiment, the first active IC device is a transistor that includes a layer of conductive material on the BOX layer adjacent the third electrode, wherein the layer of conductive material has the second polarity; a fifth electrode on the BOX layer adjacent the layer of conductive material, wherein the fifth electrode has the first polarity; a layer of gate oxide over the layer of conductive material; and a gate electrode over the layer of gate oxide. In another aspect, the first active IC device is a capacitor that includes a fifth electrode of the first polarity above the third electrode; a layer of oxide between the third electrode and the fifth electrode. In another aspect, the IC system further includes a first high voltage device formed directly on the substrate, the first high voltage device being coupled to receive a signal indicating a voltage to be applied to the third electrode from the control circuitry, and to provide the third voltage source; and a second high voltage device formed directly on the substrate, the second high voltage device being coupled to receive a signal indicating a voltage to be applied to the fourth electrode from the fuse control circuitry, and to provide the fourth voltage source. In another aspect, the second active IC device is a transistor that includes a second layer of conductive material on the BOX layer adjacent the fourth electrode, wherein the second layer of conductive material has the first polarity; a sixth electrode on the BOX layer adjacent the second layer of conductive material, wherein the sixth electrode has the second polarity; a second layer of gate oxide over the second layer of conductive material; and a second gate electrode over the second layer of gate oxide.

What is claimed is:

1. An integrated circuit (IC) system comprising:
   a substrate;
   a first doped well of a first polarity in the substrate;
   a first electrode in contact with the doped well;
   a buried oxide (BOX) in contact with the doped well in the substrate;
   a first IC device including a second electrode formed on the BOX;
   fuse control circuitry coupled to the first electrode and the second electrode, the fuse control circuitry is configured to cause voltages to be applied to the first and second electrodes to change a resistance level of the BOX in the vicinity of the second electrode, wherein the voltages are applied to the first and second electrodes to write a data value by changing the resistance level, and different voltages are applied to the first and second electrodes to read the resistance level.

2. The IC system of claim 1, the first IC device is a capacitor further comprising:
   a third electrode above the second electrode;
   a layer of oxide between the second electrode and the third electrode.

3. The IC system of claim 1, the first IC device is a transistor further comprising:
   a layer of conductive material on the BOX adjacent the second electrode, wherein the layer of conductive material has a different polarity than the second electrode;
   a third electrode on the BOX adjacent the layer of conductive material, wherein the second and third electrodes have the same polarity;
   a layer of gate oxide over the layer of conductive material; and
   a gate electrode over the layer of gate oxide.

4. The IC system of claim 1, further comprising:
   a high voltage device formed directly on the substrate, the high voltage device being coupled to receive a signal indicating a voltage to be applied to the first IC device from the fuse control circuitry, and to provide a voltage signal to the first IC device.

5. The IC system of claim 4, wherein the high voltage device is a laterally diffused metal oxide semiconductor (LDMOS) transistor.

6. The IC system of claim 1, wherein the voltages applied to the first and second electrodes create a low resistance path by causing the BOX to breakdown in the vicinity of the second electrode.

7. The IC system of claim 3, further comprising a connection between the gate electrode and a voltage source and between the third electrode and another component.

8. The IC system of claim 2, further comprising:
   a connection between the third electrode and another component.

9. An integrated circuit (IC) system comprising:
   a substrate;
   a first doped well of a first polarity in the substrate;
   a first electrode in contact with the doped well;
   a buried oxide (BOX) in contact with the doped well in the substrate;
   a first IC device including a second electrode formed on the BOX;
   fuse control circuitry coupled to the first electrode and the second electrode, the fuse control circuitry is configured to cause voltages to be applied to the first and second electrodes to change a resistance level of the BOX in the vicinity of the second electrode, wherein the first IC device is a capacitor further comprising:
   a third electrode above the second electrode, and
   a layer of oxide between the second electrode and the third electrode.

10. The IC system of claim 9, further comprising:
a high voltage device formed directly on the substrate, the high voltage device being coupled to receive a signal indicating a voltage to be applied to the first IC device from the fuse control circuitry, and to provide a voltage signal to the first IC device.

11. The IC system of claim 10, wherein the high voltage device is a laterally diffused metal oxide semiconductor (LDMOS) transistor.

12. The IC system of claim 9, wherein the voltages applied to the first and second electrodes create a low resistance path by causing the BOX to breakdown in the vicinity of the second electrode.

13. The IC system of claim 9, wherein the voltages are applied to the first and second electrodes to write a data value by changing the resistance level, and different voltages are applied to the first and second electrodes to read the resistance level.

14. The IC system of claim 9, further comprising:
a connection between the third electrode and another component.

15. An integrated circuit (IC) system comprising:
a substrate;
a first doped well of a first polarity in the substrate;
a first electrode in contact with the doped well;
a buried oxide (BOX) in contact with the doped well in the substrate;
a first IC device including a second electrode formed on the BOX;
fuse control circuitry coupled to the first electrode and the second electrode, the fuse control circuitry is configured to cause voltages to be applied to the first and second electrodes to change a resistance level of the BOX in the vicinity of the second electrode, wherein the first IC device is a transistor further comprising:
a layer of conductive material on the BOX adjacent the second electrode, wherein the layer of conductive material has a different polarity than the second electrode,
a third electrode on the BOX adjacent the layer of conductive material, wherein the second and third electrodes have the same polarity,
a layer of gate oxide over the layer of conductive material, and
a gate electrode over the layer of gate oxide.

16. The IC system of claim 15, further comprising:
a high voltage device formed directly on the substrate, the high voltage device being coupled to receive a signal indicating a voltage to be applied to the first IC device from the fuse control circuitry, and to provide a voltage signal to the first IC device.

17. The IC system of claim 16, wherein the high voltage device is a laterally diffused metal oxide semiconductor (LDMOS) transistor.

18. The IC system of claim 15, wherein the voltages applied to the first and second electrodes create a low resistance path by causing the BOX to breakdown in the vicinity of the second electrode.

19. The IC system of claim 15, wherein the voltages are applied to the first and second electrodes to write a data value by changing the resistance level, and different voltages are applied to the first and second electrodes to read the resistance level.

20. The IC system of claim 15, further comprising a connection between the gate electrode and a voltage source and between the third electrode and another component.

21. An integrated circuit (IC) system comprising:
a substrate;
a first doped well of a first polarity in the substrate;
a first electrode in contact with the doped well;
a buried oxide (BOX) in contact with the doped well in the substrate;
a first IC device including a second electrode formed on the BOX;
fuse control circuitry coupled to the first electrode and the second electrode, the fuse control circuitry is configured to cause voltages to be applied to the first and second electrodes to change a resistance level of the BOX in the vicinity of the second electrode; and
a high voltage device formed directly on the substrate, the high voltage device being coupled to receive a signal indicating a voltage to be applied to the first IC device from the fuse control circuitry, and to provide a voltage signal to the first IC device.

22. The IC system of claim 21, the first IC device is a capacitor further comprising:
a third electrode above the second electrode;
a layer of oxide between the second electrode and the third electrode.

23. The IC system of claim 21, the first IC device is a transistor further comprising:
a layer of conductive material on the BOX adjacent the second electrode, wherein the layer of conductive material has a different polarity than the second electrode;
a third electrode on the BOX adjacent the layer of conductive material, wherein the second and third electrodes have the same polarity;
a layer of gate oxide over the layer of conductive material; and
a gate electrode over the layer of gate oxide.

24. The IC system of claim 21, wherein the high voltage device is a laterally diffused metal oxide semiconductor (LDMOS) transistor.

25. The IC system of claim 21, wherein the voltages applied to the first and second electrodes create a low resistance path by causing the BOX to breakdown in the vicinity of the second electrode.

26. The IC system of claim 21, wherein the voltages are applied to the first and second electrodes to write a data value by changing the resistance level, and different voltages are applied to the first and second electrodes to read the resistance level.

27. The IC system of claim 23, further comprising a connection between the gate electrode and a voltage source and between the third electrode and another component.

28. The IC system of claim 22, further comprising:
a connection between the third electrode and another component.

* * * * *